United States Patent
Jernej et al.

(10) Patent No.: US 12,262,498 B2
(45) Date of Patent: Mar. 25, 2025

(54) VEHICLE MODULE HAVING A MANIPULATION-DETECTING ELECTRONIC CONTROL UNIT

(71) Applicant: ZKW Group GmbH, Wieselburg (AT)

(72) Inventors: Günther Jernej, Graz (AT); Dietmar Kieslinger, Theresienfeld (AT); Marion Schubert, Vösendorf (AT); Christoph Haiden, Ternitz (AT); Bernhard Androsch, Neudörfl (AT); Dominic Seibert, Neunkirchen (AT); Jiri Šonský, Wiener Neustadt (AT)

(73) Assignee: ZKW Group GmbH, Wieselburg (AT)

( * ) Notice: Subject to any disclaimer, the term of this patent is extended or adjusted under 35 U.S.C. 154(b) by 207 days.

(21) Appl. No.: 18/013,745

(22) PCT Filed: Jul. 2, 2021

(86) PCT No.: PCT/EP2021/068338
§ 371 (c)(1),
(2) Date: Dec. 29, 2022

(87) PCT Pub. No.: WO2022/012973
PCT Pub. Date: Jan. 20, 2022

(65) Prior Publication Data
US 2023/0301006 A1  Sep. 21, 2023

(30) Foreign Application Priority Data
Jul. 14, 2020  (EP) .................................... 20185749

(51) Int. Cl.
*B60Q 1/14* (2006.01)
*H05K 7/14* (2006.01)

(52) U.S. Cl.
CPC ......... *H05K 7/1427* (2013.01); *B60Q 1/1415* (2013.01)

(58) Field of Classification Search
CPC .. B60Q 1/1415; B60Q 1/2696; H05K 5/0208; H05K 7/1427; B60R 25/00
See application file for complete search history.

(56) References Cited

U.S. PATENT DOCUMENTS

| | | | | |
|---|---|---|---|---|
| 8,277,099 | B2* | 10/2012 | Hamashima | B60Q 1/068 362/547 |
| 9,651,210 | B2* | 5/2017 | Ziegler | F21S 41/285 |
| 9,656,598 | B1* | 5/2017 | Salter | G02B 6/002 |
| 10,864,849 | B2* | 12/2020 | Simms | B60Q 3/30 |
| 2017/0327034 | A1* | 11/2017 | Salter | B60Q 1/0035 |
| 2020/0042751 | A1 | 2/2020 | Aurelien et al. | |
| 2021/0245653 | A1* | 8/2021 | Sorg | B60Q 1/0023 |

OTHER PUBLICATIONS

International Search Report for PCT/EP2021/068338 dated Oct. 5, 2021 (14 pages).
Search Report for European Patent Application No. 20185749.7 dated Dec. 16, 2020 (9 pages).

* cited by examiner

*Primary Examiner* — Tung X Le
(74) *Attorney, Agent, or Firm* — Eversheds Sutherland (US) LLP

(57) ABSTRACT

The invention relates to a vehicle module (10), including a manipulation-detecting electronic control unit (1), wherein the electronic control unit (1) is equipped in order to control at least one electrically controllable vehicle function, for example a light function, such as a low-beam light function or a high-beam light function.

20 Claims, 5 Drawing Sheets

Figure 1:
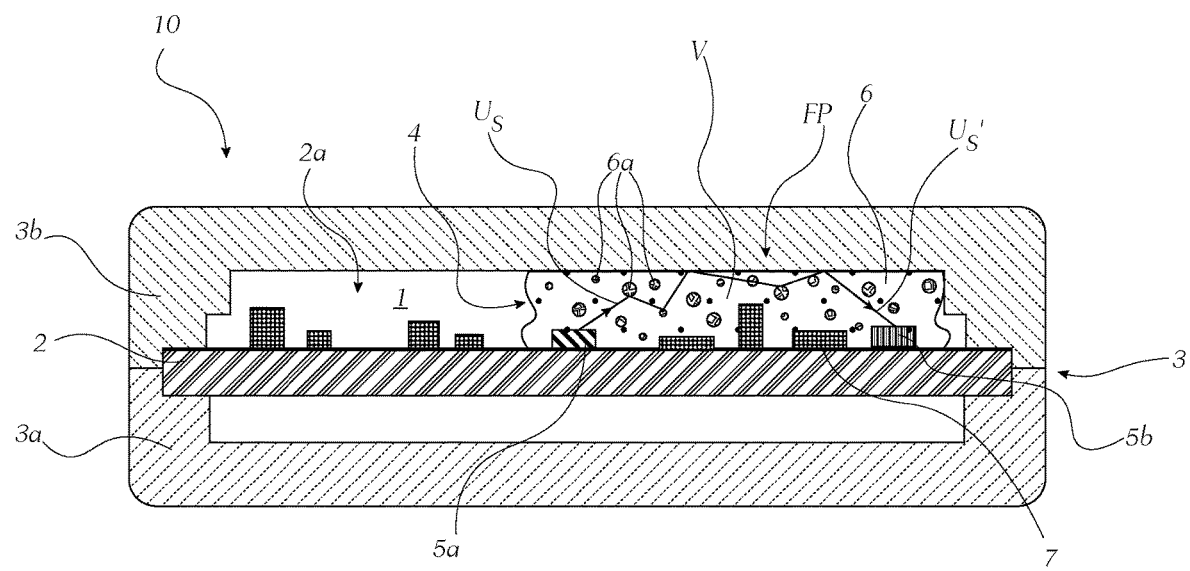

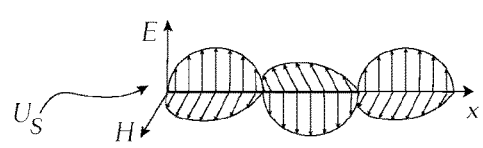
Fig. 3b
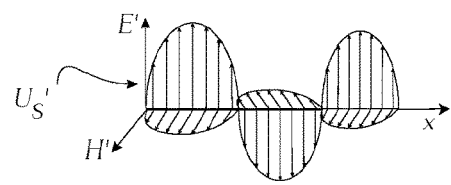
Fig. 3c
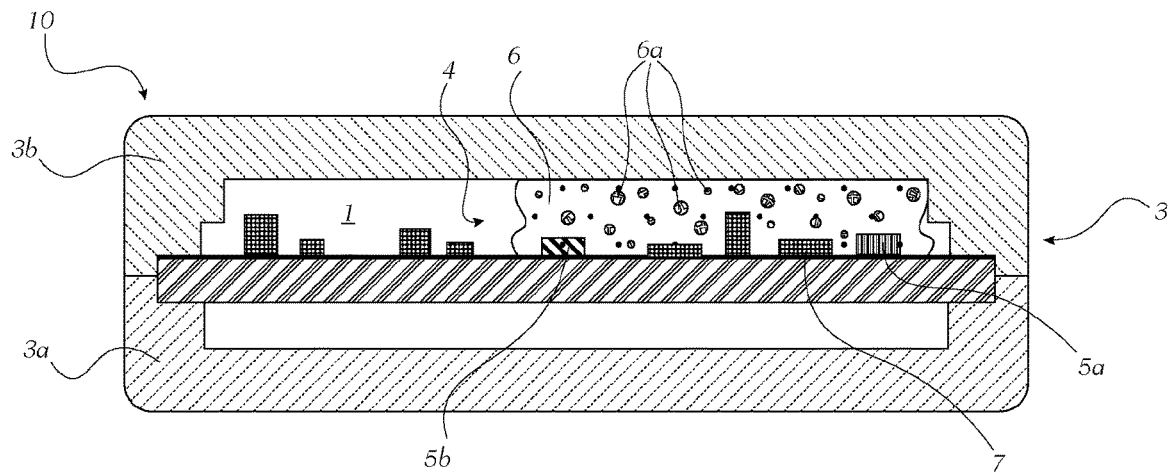
Fig. 3a
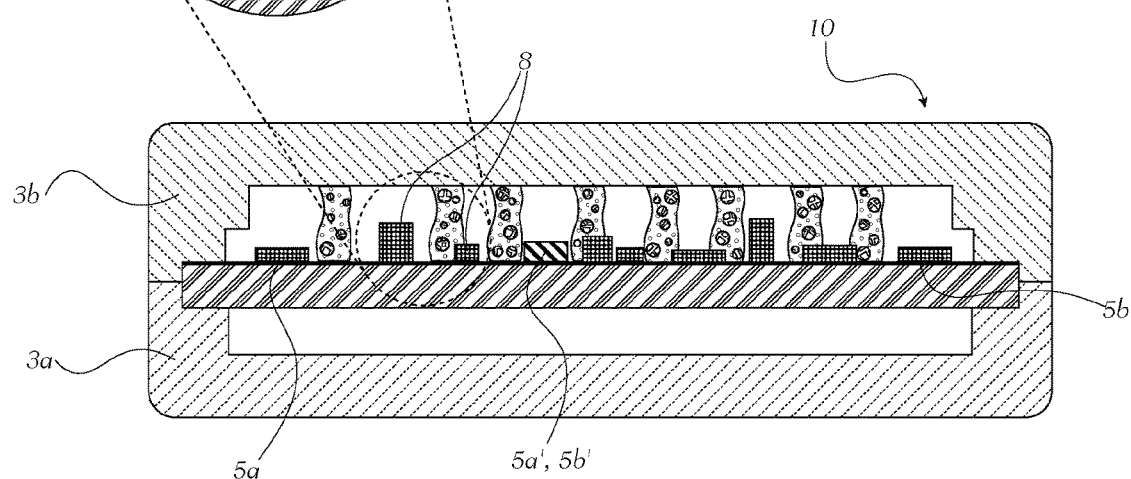
Fig. 4b
Fig. 4a

VEHICLE MODULE HAVING A MANIPULATION-DETECTING ELECTRONIC CONTROL UNIT

The invention relates to a vehicle module.

Further, the invention relates to a motor vehicle headlamp, including a vehicle module according to the invention and to a method for using a vehicle module according to the invention.

For the protection from water, other environmental influences and also from a manipulation from the outside, vehicle modules include closed housings in order to enclose the sensitive electronics of the vehicle modules.

A manipulation of the electronics can take place for example by the opening of the housing and also by objects entering the housing. For example, a manipulation could take place in that an opening is drilled into a cover of the housing without lifting off the cover of the housing.

The object of the invention therefore consists in creating a vehicle module that reliably detects manipulations of different types.

This object is solved with a vehicle module of the type mentioned at the outset, which according to the invention includes a manipulation-detecting electronic control unit, wherein the electronic control unit is equipped in order to control at least one electrically controllable vehicle function, for example a light function, such as for example a low-beam light function or a high-beam light function, wherein the electronic control unit includes the following:
- at least one circuit carrier, in particular a printed board, including an electrical circuit for carrying out the control by the electronic control unit,
- a housing, which at least partially encloses the circuit carrier, wherein the housing includes at least two parts, wherein on a first part of the housing the circuit carrier is mounted, and wherein a second part of the housing can be mounted on the first part in order to at least partially close the housing and thus at least partially enclose the circuit carrier, and
- a monitoring system arranged on the circuit carrier for detecting an entry into the housing, wherein this monitoring system includes the following:
- a transmitting device for emitting an electromagnetic monitoring signal into the volume to be monitored enclosed by the housing, wherein the electromagnetic monitoring signal is in a wave length range between 230 nm and 30 m,
- scatter material, which in the volume to be monitored is at least partially randomly distributed in the non-manipulated state and is equipped in order to scatter the emitted electromagnetic monitoring signal,
- a receiving device for receiving the electromagnetic monitoring signal scattered within the volume to be monitored, wherein the distribution of the scatter material that is at least partially random in the non-manipulated state is selected so that by way of a comparison of the emitted monitoring signal with the received signal scattered in the scattering medium a module-individual fingerprint is measurable, wherein this value represents a target value of a non-manipulated state, and
- a manipulation detection unit, which is fed information regarding the module-individual fingerprint in the non-manipulated state, at least in the form of the target value, wherein the manipulation detection unit is connected to the electrical circuit in order to conclude the actual value of the module-individual fingerprint by capturing the received actual state of the monitoring signal, wherein the manipulation detection unit is equipped in order to compare the actual value and target value of the fingerprint and, dependent on the result of the comparison, conclude a manipulation of the volume to be monitored.

The transmitting device and/or receiving device can be formed free of electrodes. The random distribution of the scattering medium can, on the one hand, be caused by a random spatial distribution of the scattering medium (i.e. during the manual or mechanical introduction operation of the scattering medium). Complementarily or alternatively to this, scattering elements can also be randomly arranged within the scattering medium, so that a module-individual fingerprint is measurable. Obviously, the term "fingerprint" in this context does not mean a human fingerprint. This expression is to be understood as a synonym for at least one measurement value that is module-specifically determinable and naturally varies from module to module. By expanding an electronic control unit that is already present anyway, the invention makes possible achieving a huge increase of the manipulation security of a vehicle module.

In particular it can be provided that the wave length range of the electromagnetic monitoring signal is between 1000 nm and 230 nm. By way of this, a monitoring in the optical wave length range is possible. It can be provided that the volume to be monitored between housing and the circuit carrier is filled up with a transparent medium comprising randomly distributed scattering centres. A light signal can be produced for example by means of laser or LED. By way of the dispensed medium, the light path can be influenced and only a certain part or even only certain frequencies of the signal can be measured at the receiver (inversely operated LED, photodiode, camera). When the housing is opened, the light distribution changes, by way of which an intrusion can be detected. Here, the more cost-effective variant would be the use of LEDs, above all SMD-LEDs, since these can be easily mounted on the circuit board with the current assembling processes. For the mooted application, low-power LEDs (rated current approximately 2 mA) would be sufficient. It can be favourable when the scatter material used is selected so that in the event of an intrusion it tears through in the middle. This type of change has a substantially greater effect on the signal to be detected than would be the case with a detachment of the scatter material from the housing or the circuit carrier. The scattering medium can be placed in particular strategically favourably on or in the vicinity of particularly "protection-worthy components", or take up the entire interior to be monitored. It can be particularly favourable when the transmitting device and/or the receiving device are/is mounted in the vicinity of the particularly "protection-worthy components".

When using lasers or LED light sources it can be provided that even multiple light sources are used, which can for example emit light of different wave lengths. When using inversely operated LEDs for the detection it can be provided that with a number of N LEDs (wherein N is a natural number), N*(N−1) optical paths are measured. An advantage in the use of inversely operated LEDs for the detection is the possibility of measuring different wave lengths, since LEDs cannot register light with a wave length that is greater than its own. This can be advantageous when the introduced medium more significantly changes the wave lengths than the light paths, since by way of the mentioned method a smaller number of optical paths, compared with variants mentioned previously, can be measured.

Further, it can be provided that the scattering medium includes transparent material in which randomly distributed light-scattering elements are contained. The term "light-scattering" can mean both light-reflecting and/or at least partially absorbing properties. Likewise, refraction (through the entry into a medium with a different refractive index) and bending effects are also relevant. The term "light-scattering" therefore means an abstract term which can include any type of manipulation during which modified light is emitted. The change can also be for example in the wave length, amplitude, phase, propagation direction, etc. The can be realised for example by inclusions of air bubbles or reflecting granulates in the scattering medium. The following materials can serve for example for being implemented as scattering medium and/or scattering element:

Transparent, curable gel with air bubbles as scattering centres: here, so-called "optically clear silicone gels" can be used. This is a very soft gel (shore OO-OOO), which is created by mixing two components. Air bubbles can be introduced here with typical diameters of d=[100 μm–2 mm]. An advantage here is that no additional granulate is needed.

Transparent, curable gel with granulate as scattering centres: a granulate with differing refractive index is mixed into the gel. (e.g. polycarbonate shredder; possibly even with different colours. When using different-colour LEDs this can be particularly relevant). An advantage here is that this variant is particularly stable mechanically.

A variant of epoxy resin with air inclusions or likewise reflecting granulate can be used here as cost-effective variant. This resin can be transparent yet sufficiently soft in the cured state, so that the same in the case that the housing is opened can tear or a gap can form and thus does not simply detach itself from the contact surfaces.

A material that pulls strings: such a material would likewise significantly change the optical path and thus the detected signal. Possible are for example variations of synthetic rubber or special compositions based on resin.

The use of a material which during the "curing" intentionally creates many shrinkage cracks is also conceivable.

In particular it can be provided that the scattering medium is formed, arranged and connected to the second part and also the circuit carrier that in the case that the second part is lifted off from the first part of the housing, the scattering medium tears into at least two material regions that are separate from one another (i.e. without the two material regions detaching from the second part of the housing or the circuit carrier). In particular it can be provided that the material pulls strings in the process. As mentioned, such a material would significantly change the optical path and thus the detected signal.

Further, it can be provided that the transmitting device for emitting the monitoring signal includes an LED, in particular an SMD-LED, or a laser light source. The receiving device can for example comprise an inversely operated LED, a photodiode and/or a camera.

It particular it can be provided that the wave length range of the electromagnetic monitoring signal is between 30 m and 1 m (based on the ambient medium air). By way of this, the monitoring can take place in a frequency range of 10 MHz to 300 MHz.

Should, based on criteria such as for example material saving, a punctiform distribution of the scattering medium be desired, this would be possible when the fingerprint is realised for example as ohmic resistance. By way of this, the same would have its own EM field (or an associated distribution of the field lines) and a destruction of its structure would have a significant influence on the value to be measured.

As scattering medium or material employed for this purpose for the use of a monitoring signal in a wave length range between 30 m and 1 m, the following materials are possible for example:

A material can be selected in the case of which $\varepsilon_r$ (relative electrical permittivity) and $\mu_r$ (relative magnetic permittivity) is distinct from air. For a greater difference of the EM (electromagnetic) radiation with destroyed or intact material, the value $\mu_r$ is even more decisive than the value $\varepsilon_r$.

A further possibility consists in using a foam with randomly distributed ferrite or metal chips.

When the fingerprint is to be realised by means of ohmic resistance, the conductive properties of the material are obviously of great relevance. Then, a material with significantly higher electrical conductivity than air should be selected.

In general, any material is suitable whose influence on the EM radiation is big enough in order to render destruction measurable.

Further, it can be provided that the scattering medium punctiformly contacts the circuit carrier and the second part of the housing (mechanically and if required electrically) and connects the same, wherein the scattering medium fills out between 5% and 95% of the volume to be monitored.

In particular it can be provided that the radiation emitted by the electronic control unit in a target operation is utilised as monitoring signal and the transmitting device is thus realised by the electronic control unit, or the transmitting device is realised by a high frequency mixer that is separate from the electronic control unit. The term "target operation" is to mean an operating state which is routinely provided and has as the object the fulfilment of a target function of the electronic control unit (for example of the control of a light function). The radiation of the monitoring signal in this case takes place as a useful by-product because of the corresponding operation of the electronic control unit. The expression "target operation" does not exclude that other desired operating states of the electronic control unit can be additionally provided. It is merely at least one operating mode that can be selected from a multiplicity of different target operating modes. The term "high frequency mixer" is to mean a mixer which transfers a certain frequency band into a lower or higher frequency band. The frequency of the mixture is determined by a local oscillator (LO). In a particularly advantageous embodiment, the signal to be measured is the internal electromagnetic radiation, the ECU (which can be formed as part of the electronic control unit). Disadvantage with this variant is that the measured spectrum has to be exactly defined here in order to avoid that an interference of the measured signal through external EM influences occurs. Furthermore, the operating state in which the measurement is carried out should also be accurately defined in this variant, since the operation of other assemblies can already cause a significant change of the measured signal. Here it would be advisable to view a special frequency range in which the interference signals entering from the outside are minimal. On the ECU board, a printed line can be provided which serves as receiving aerial. An advantage of this variant on the one hand is that no additional transmitter is necessary, and on the other hand, because of the differences within the scope of the component production, the individuality is already given by the EM signal generated by the ECU, as a result of which an additional individualisation by means of a random fingerprint enlarges the individuality of the respective electronic unit.

Likewise, an HF (=high frequency) mixer with oscillator can be connected to this aerial. The output of the mixer should be connected to the CPU by means of one or two analogue inputs. This makes possible to determine the high frequency amplitude received by the aerial and the associated phase over a certain frequency range. As signal for the tamper detection the differential frequency between inputs signal and LO (=local oscillator) can be used. The realistic measuring range in this case is between 100 kH-5 GHz. In detail, a frequency can be selected here which is very significantly distinct from the remaining spectrum. This can either be realised with an additional component or with the additional activation of an already existing component. In the first variant, a component is applied to the circuit board whose sole object it is to emit an electromagnetic signal at a certain time. Alternatively to this, a special component can be briefly activated with a significant EM spectrum. An SBC (system basic chip) already present on the circuit carrier would be particularly suitable for this purpose. For the measurement it is advantageous when the transmission is measured between transmitter and receiver. The reason for this is that here the ratio between transmitter amplitude and receiving amplitude is considered, as a result of which the value obtained is independent of the transmitter output.

Further it can be provided that the scattering medium has a di-electricity number $\varepsilon_r$ and/or a permittivity number $\mu_r$, which differs from the value 1 by at least 25%.

In particular it can be provided that the wave length range of the electromagnetic monitoring signal is between 1 mm and 30 cm. In this case, the monitoring can take place by means of radar signals. In the scatter material, scattering centres should be selected according to the wave length of the radar. This scattering centre can be present for example only in one place in the space. For this variant, materials pulling strings would be particularly suitable since these can be better detected by the radar. In the case of a "brittle" material, the material is selected so that the fracture for the wave length of the radar is in fact detectable.

Further, it can be provided that the transmitting device is formed as a radar chip for emitting a radar signal, which is arranged on the circuit carrier and formed in particular as part of the electronic control device. In the meantime radar variants are already available which can "scan" the space in 2×2 dimensions. Because of this, an image of the entire interior of the ECU or of the entire volume to be monitored is created. Should the housing or the fingerprint be deformed, this change is detected by the radar. The intrusion is detected. This means that the radiation into the space can take place with variable angles (for example in any direction within the opening angle of the radar chip), wherein by way of this a 2D image can be captured. A 3D image of the volume to be monitored can then be calculated for example by way of runtime measurement.

In particular it can be provided that the transmitting device and/or the receiving device are/is covered by the scattering medium which in the coverage region extends as far as to the second part of the housing.

Alternatively to this it can be provided that the scattering medium extends, without gap, between transmitting device and receiving device.

Further, it can be provided that the transmitting device and the receiving device are spaced apart from one another and the volume to be monitored is situated between the two devices, wherein the distance between the two devices amounts to at least 50%, preferentially at least 75% of the length of the circuit carrier. The term "length of the circuit carrier" is to mean the longitudinal extension of a flat carrier that is typically largely rectangular. Here, the length is greater than or at least equal to the width and extends as a straight line between two sides that are parallel to one another, wherein this straight line is normally oriented to the sides.

Alternatively to this it can be provided that the transmitting device and the receiving device are arranged in the same place on the circuit carrier. This can be favourable for example when using a radar chip.

Quite generally, the following statements regarding the scattering medium can be made:

A material with a high heat conductivity can lead to an improvement of the thermal resistance $R_{th}$.

An improvement of the mechanical connection can be produced by a material which has a high vibration absorption.

Further materials (presumably particularly favourable for EM variants in the range 10 MHz to 300 MHz) can also contribute to the improvement of the EMC. These can be materials for example containing electrically conductive particles. These can be for example metal filaments or flakes, graphite spheroids or flakes, carbon nano-tubes or graphite flakes. If it is desired to employ particles with high conductivity (metals) that are large enough that in the untreated state they could cause short circuits on the print, either the particles or the print can be additionally coated with an insulation layer (varnish, oxide layer, etc.). Ferrite particles or particles with ferroelectrical properties such as for example barium titanate are also possible for example.

Even when the material is not dispensed so as to completely fill the space, the entire space is monitored through the method of the measurement. Thus, not only a change of the "fingerprint" material used is detected but also a change of the housing shape.

Materials, which consist of the mixture of a base with scattering centres randomly distributed therein, can also be processed so as to fill out the space.

Further, it can be provided that the monitoring system is equipped in order to compare the captured actual value of the fingerprint with the target value and in the case of a difference that is below a limit value, to store the captured actual value as new target value utilising it for the next comparison. This limit value can be selected so that a tolerance range is taken into account as safety buffer and does not result in a defective trigger. By way of this, ageing manifestations of the fingerprint can be taken into account. For this purpose, an upper limit for that value that is still technically conceivable as age-related change can be provided. This upper limit can be for example a difference of around 10% of the target value. Should the change exceed this value, it is possible for example to assume a manipulation. A time component could also be taken into account and the limit value for the maximum change based on ageing be determined as a function of the time interval to the last start-up. Accordingly it can be provided that with a time interval of only a few days a change of less than 1% is permissible, whereas in the case of time intervals of months or years, greater changes are permissible. By a one-off measuring for example only during the start-up operation, energy can be saved. In addition, an error routine can be initiated when a manipulation is detected, which includes for example the resetting into an operationally secure predefined state.

Further, the invention relates to a motor vehicle headlamp including a vehicle module according to the invention.

In particular, the invention relates to a method for using a vehicle module according to the invention, wherein during the production and configuration process of the vehicle module a basic setting procedure is carried out in which an initial fingerprint is determined and stored as reference value in the vehicle module and in an external memory. In this way, the individual vehicle module can be uniquely identified for example by comparison with a database even later because of the capture of the individual fingerprint. Further, it can be provided that the limit value has a time component and increases with increasing time interval to the last start-up.

In the following, the invention is explained in more detail by way of exemplary and non-restrictive embodiments, which are illustrated in the figures. Therein it shows FIG. 1 a schematic representation of a first embodiment of the invention, FIG. 2 a schematic representation of a second embodiment of the invention, FIG. 3a a schematic representation of a third embodiment of the invention, FIG. 3b an exemplary representation of a transmitted monitoring signal, FIG. 3c an exemplary representation of a received monitoring signal, FIG. 4a a schematic representation of a fourth embodiment of the invention, FIG. 4b a detail representation of field lines regarding components of the embodiment according to FIG. 4a, FIG. 5 a plan view of a further embodiment of the invention, FIGS. 6a to 6c a scattering medium in the applied state before, during and after a manipulation, and FIGS. 7a to 7c a scattering medium which pulls strings when a mechanical connection is disconnected.

Unless otherwise stated, same reference numbers designate same features in the following figures.

FIG. 1 shows a schematic representation of a first embodiment of the invention. Therein a vehicle module 10 is shown, which includes a manipulation-detecting electronic control unit 1. The electronic control unit 1 is equipped in order to at least control an electrically controllable vehicle function such as for example a light function, such as a low-beam light function or a high-beam light function, wherein the electronic control unit 1 includes the following: at least one circuit carrier 2, in particular a printed board, including an electrical circuit 2a for carrying out the control by the electronic control unit 1, a housing 3, which at least partly encloses the circuit carrier 2, wherein the housing 3 includes at least two parts 3a, 3b, wherein the circuit carrier 2 is mounted on a first part 3a of the housing 3, and wherein a second part 3b of the housing 3 can be mounted on the first part 3a in order to at least partly enclose the housing 3 and thus at least partly enclose the circuit carrier 2, and a monitoring system 4 arranged on the circuit carrier 2, for detecting an entry into the housing 3.

The monitoring system 4 includes a transmitting device 5a for emitting an electromagnetic monitoring signal $U_s$ into the volume V to be monitored enclosed by the housing 3, wherein the electromagnetic monitoring signal $U_s$ basically is in a wave length range between 230 nm and 30 m. Scatter material 6, which in the non-manipulated state is at least partially distributed randomly in the volume V to be monitored and equipped in order to scatter the emitted electromagnetic monitoring signal $U_s$, a receiving device 5b for receiving the electromagnetic monitoring signal $U_s$ scattered within the volume V to be monitored, wherein the at least partial random distribution of the scatter material in the non-manipulated state is selected so that by way of a comparison of the emitted monitoring signal $U_s$ with the received signal $U_s'$ scattered in the scattering medium, a value of a module-individual fingerprint FP is measurable, wherein this value represents a target value $S_{soll}$ of a non-manipulated state, and a manipulation detection unit 7, which is supplied with information regarding the module-individual fingerprint FP in the non-manipulated state, at least in the form of the target value, wherein the manipulation detection unit 7 is connected to the electrical circuit 2a in order to conclude the actual value $S_{ist}$ of the module-individual fingerprint FP by capturing the received actual state of the monitoring signal $U_s$, wherein the manipulation detection unit 7 is equipped in order to compare the actual value $S_{ist}$ and target value $S_{soll}$ of the fingerprint FP (in FIGS. 6a to 7c the target value is represented by the fingerprint FP which in the non-manipulated state also corresponds to the actual value; the fingerprint FP' is captured by detecting the changed actual value) and dependent on the result of the comparison, conclude a manipulation of the volume V to be monitored. In the examples according to FIGS. 1 and 2, the monitoring signal $U_s$ is an optical signal, so that the wave length range of the electromagnetic monitoring signal $U_s$ is between 1000 nm and 230 nm. For this purpose it can be provided that the transmitting device 5a for emitting the monitoring signal $U_s$ includes an LED, in particular and SMD-LED, or a laser light source. The receiving device 5b can be for example a inversely operated LED, a photodiode or a camera. The transmitting device 5a and/or the receiving device 5b in this embodiment are/is covered by the scattering medium 6 which in the coverage region extends as far as to the second housing part 3b.

The scattering medium 6 includes transparent material in which randomly distributed light-scattering elements 6a are received. The scattering medium 6 is arranged in such a manner that it is connected to the second housing part 3b and also to the circuit carrier 2, so that in the case that the second housing part 3b is lifted off from the first housing part 3a, the scattering volume 6 tears in at least two material regions that are separate from one another (see also FIGS. 6a to 7c).

Figure 2:
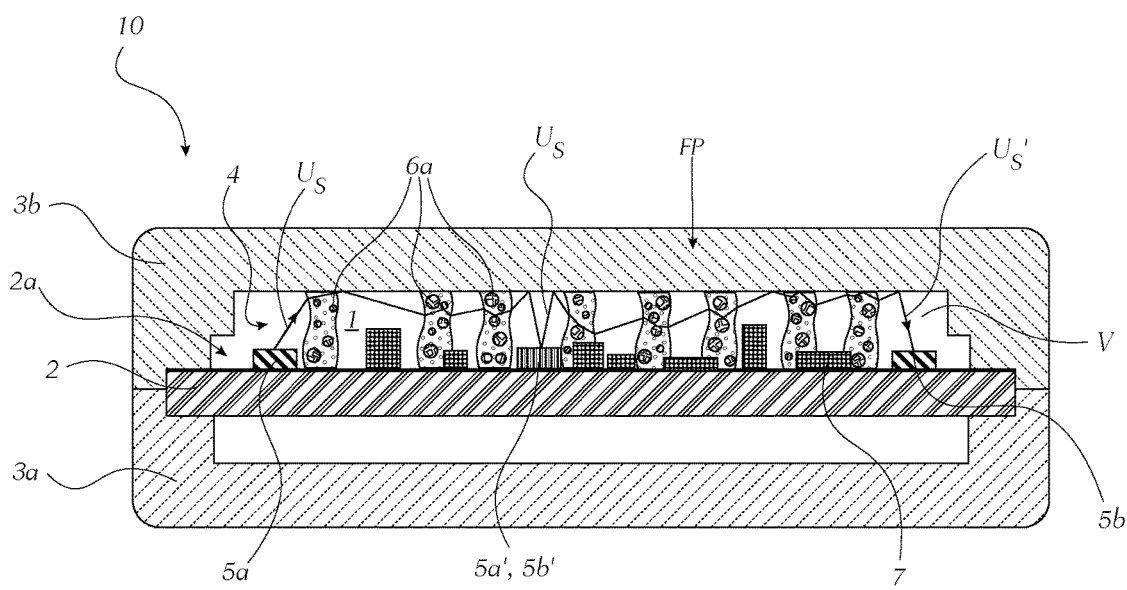

FIG. 2 shows a schematic representation of a second embodiment of the invention. Therein, the scattering medium 6 is not applied in the form of a continuous filling, but by individual column-shaped connections which act on the circuit carrier 2 and the housing part 3b. Transmitting device 5a and receiving device 5b are arranged at opposite ends of the circuit carrier 2, so that all components located in between can be monitored, in that all of these components are enclosed by individual regions of the scattering medium 6. To increase the sensitivity of the monitoring it can also be provided that additional transmitting units 5a' or receiving units 5b' are provided. The transmitting device 5a and/or the receiving device 5b in this embodiment are enclosed by air and the scattering medium 6 is spaced apart from the transmitting device 5a and/or the receiving device 5b. Between the two installations 5a, 5b is located the volume V to be monitored, wherein the distance between the two installations amounts to at least 50%, preferentially at least 75% of the length of the circuit carrier 2.

FIG. 3a shows a schematic representation of a third embodiment of the invention in which for example the positions of the transmitter and receiving device 5a and 5b respectively are switched compared with the first embodiment and the scattering medium 6 or scattering elements contained therein are selected so that the emitted monitoring signal $U_s$ and the received monitoring signal $U_s'$ differ for example by the ratio of electric to magnetic field strength (see FIGS. 3b and 3c). FIG. 3b shows an exemplary representation of an emitted monitoring signal, wherein x designates the propagation direction and the magnetic field strength H as well as the electrical field strength E are shown, wherein these field strengths are vectors. The cross-product from these vectors constitutes the pointing vector which represents the power flow of the electromagnetic signal. In FIG. 3c it is noticeable that in the case of the received monitoring signal $U_s'$ the magnetic field strength has decreased and the electrical field strength increased. Obviously, the scattering medium 6 or the scattering elements 6a can also be selected so that the electrical field strength decreases and the magnetic field strength increases. The power flow in total can also be reduced through absorption or reflection along the propagation path. All this information can be captured by comparison of emitted signal $U_s$ and received signal $U_s'$, as a result of which a module-individual fingerprint FP can be calculated. The scattering medium 6 can also be selected so that the same has an effect on the frequency or the frequency distribution of the received signal $U_s'$. By using a frequency mixer the sensitivity of the manipulation detection device can be additionally increased in that sensitive frequency regions in particular reference frequencies, are specifically analysed.

FIG. 4a shows a schematic representation of a fourth embodiment of the invention, in which in contrast with the variants according to FIGS. 1 to 2, no optical light rays, but electromagnetic signals in a frequency range between 10 Mhz and 300 MHz are radiated. FIG. 4b shows the distribution of field lines around components 8 to be monitored in the form of dashed elliptical lines. For improbity, the insertion of a plurality of the reference numbers has been omitted. Apart from the other frequency range of the monitoring signal $U_s$, all components can be formed analogously to the variant according to FIG. 2.

Figure 5:
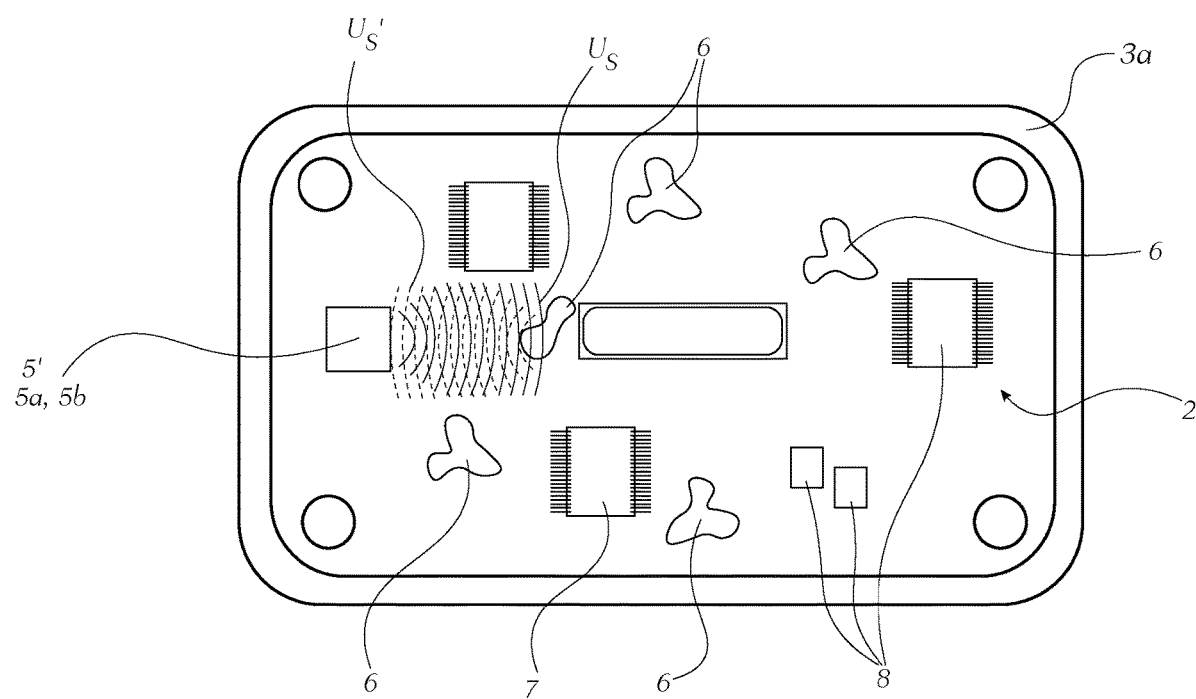

FIG. 5 shows a plan view of a further embodiment of the invention, in which an exemplary spatial distribution of the scattering medium 6 along the two-dimensional plane of the circuit carrier 2 is noticeable. There it can be provided that the emitted monitoring signal $U_s$ as well as the received, here reflected, monitoring signal $U_s'$ is a radar signal. The transmitting device 5a and the receiving device 5b can be designed for example in one piece in the form of a single radar chip 5'. The radar chip 5' is arranged on the circuit carrier 2 and formed in particular as part of the electronic control device 1.

Figure 6A:
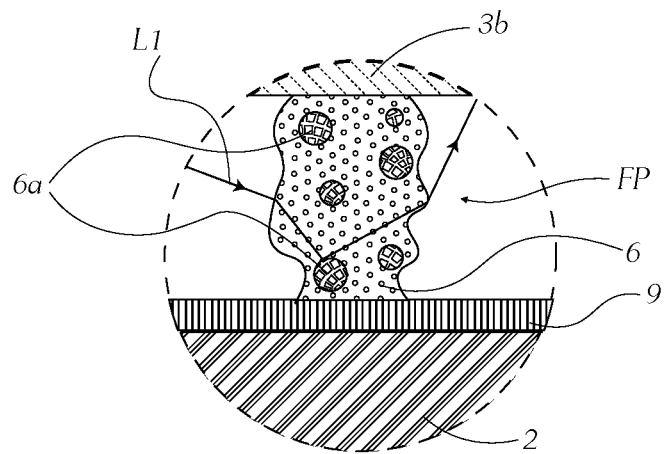
Figure 6B:
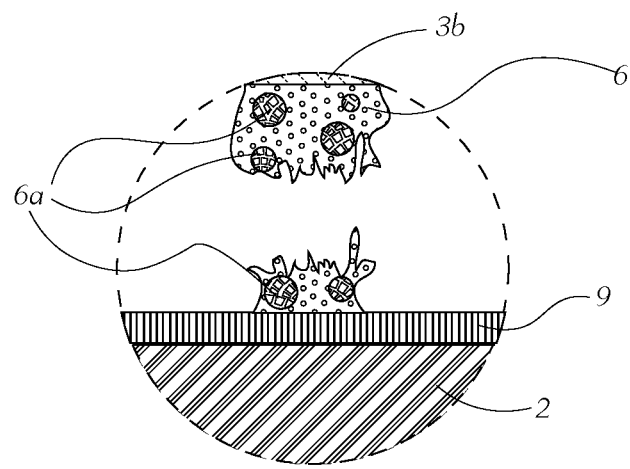
Figure 6C:
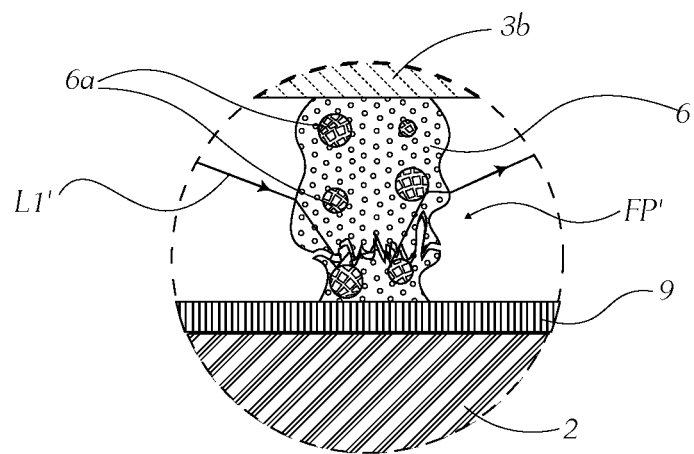

FIGS. 6a to 6c show a scattering medium 6 in the applied state, namely before (FIG. 6a), during (FIG. 6b) and after a manipulation (FIG. 6c). There it is noticeable how the scattering medium 6 tears when the cover 3b is lifted off. A renewed mounting of the cover 3b or a return into its original position (see FIG. 6c) also continues to remain detectable because of the change of the scattering medium 6, as a result of which a fingerprint FP associated with the former was changed (namely towards the manipulated fingerprint FP'), wherein this change, as already described thoroughly, can be detected and utilised for establishing the manipulation. This change of the fingerprint is also detectible by the change of an exemplary beam path L1 (FIG. 6a) towards L1' (FIG. 6c).

Figure 7A:
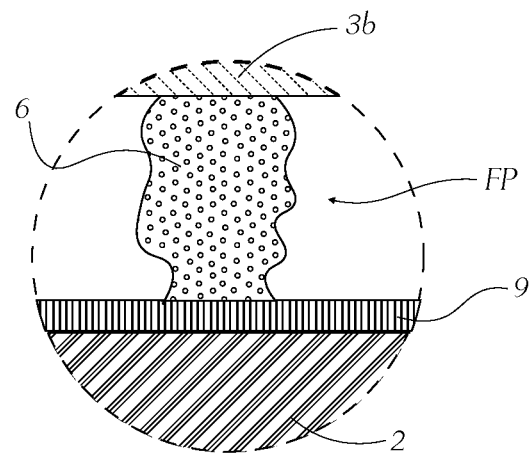
Figure 7B:
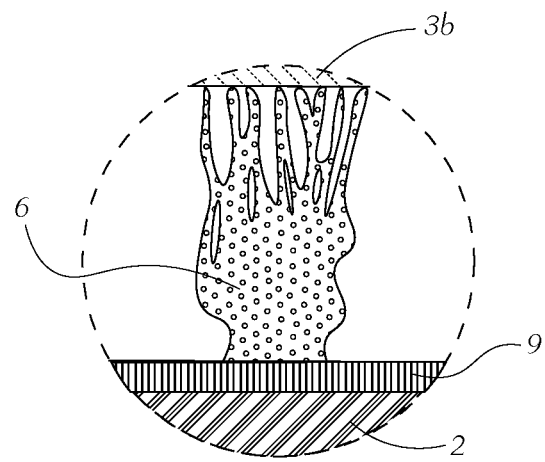
Figure 7C:
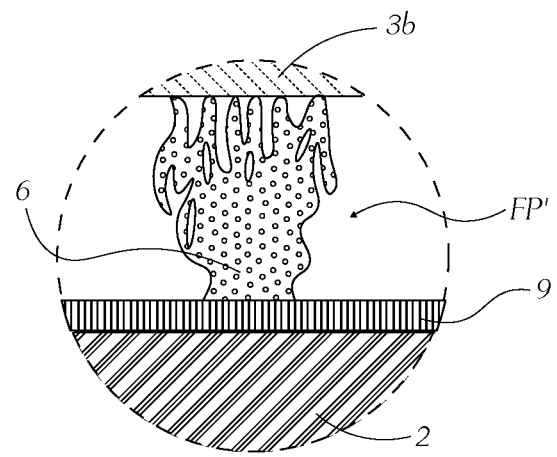

FIGS. 7a to 7c show a scattering medium 6 which, upon disconnection of a mechanical connection, pulls strings. As already mentioned, such a material, upon a manipulation, can significantly change the optical path of the monitoring signal $U_s$ and thus the detected signal $U_s'$. FIG. 7a additionally shows that a solder resist varnish layer 9 can be formed on the surface of the circuit carrier 2.

Further, the invention relates to a motor vehicle headlamp that is not shown in the figures, including a vehicle module 10 according to the invention and a method for using a vehicle module 10 according to the invention, wherein during the production and configuration process of the vehicle module 10 a basic setting procedure is carried out, in which an initial fingerprint FP is determined and stored as reference value in the vehicle module and an external memory.

The invention is not restricted to the shown embodiments, but defined by the entire scope of protection of the claims. Individual aspects of the invention or of the embodiments can also be adopted and combined. Any reference numbers in the claims are exemplary and serve only for the easier legibility of the claims without restricting these.

The invention claimed is:

1. A vehicle module (10) including a manipulation-detecting electronic control unit (1), wherein the electronic control unit (1) is equipped to control at least one electrically controllable vehicle function, wherein the electronic control unit (1) comprises:
at least one circuit carrier (2) including an electrical circuit (2a) for carrying out the control by the electronic control unit (1);
a housing (3), which at least partially encloses the at least one circuit carrier (2), wherein the housing (3) includes at least two parts (3a, 3b) wherein on a first part (3a) of the housing (3) the at least one circuit carrier (2) is mounted, and wherein a second part (3b) of the housing (3) is configured to be mounted on the first part (3a), in order to at least partially enclose the housing (3) and thus at least partially enclose the at least one circuit carrier (2); and
a monitoring system (4) arranged on the at least one circuit carrier (2) for detecting an entry into the housing (3),
wherein the monitoring system (4) comprises:
a transmitted device (5a) for emitting an electromagnetic monitoring signal ($U_s$) into the volume (V) to be monitored enclosed by the housing (3), wherein the electromagnetic monitoring signal ($U_s$) is in a wavelength range between 230 nm and 30 m,
scatter material (6), which in the volume (V) to be monitored is at least partially randomly distributed in the non-manipulated state and equipped in order to scatter the emitted electromagnetic monitoring signal,
a receiving device (5b) for receiving the electromagnetic monitoring signal ($U_s$) scattered within the volume (V) to be monitored, wherein the at least partially random distribution of the scatter material in the non-manipulated state is selected so that by way of a comparison of the emitted monitoring signal ($U_s$) with the received signal scattered in the scattering medium, a value of a module-individual fingerprint (FP) is measurable, wherein the value represents a target value ($S_{soll}$) of a non-manipulated state, and
a manipulation detection unit (7), which is supplied information regarding the module-individual fingerprint (FP) in the non-manipulated state, at least in the form of the target value, wherein the manipulation detection unit (7) is connected to the electrical circuit (2a) in order to conclude the actual value ($S_{ist}$) of the module-individual fingerprint (FP) by capturing the received actual state of the monitoring signal ($U_s$), wherein the manipulation detection unit (7) is equipped for comparing the actual value ($S_{ist}$) and the target value ($S_{soll}$) of the fingerprint (FP) and dependent on the result of the comparison, conclude a manipulation of the volume (V) to be monitored.

2. The vehicle module (10) according to claim 1, wherein the wave length range of the electromagnetic monitoring signal ($U_s$) is between 1000 nm and 230 nm.

3. The vehicle module (10) according to claim 2, wherein the scattering medium (6) includes transparent material in which randomly distributed light scattering elements (6a) are received.

4. The vehicle module (10) according to claim 2, wherein the scattering medium (6) is formed, arranged in such a manner and connected to the second housing part (3b) and also the circuit carrier (2) so that in the case that the second part (3b) is lifted off from the first part (3a) the scattering medium (6) tears into at least two material regions separate from one another.

5. The vehicle module (10) according to claim 2, wherein the transmitting device (5a), for emitting the monitoring signal ($U_s$), includes an LED or a laser light source.

6. The vehicle module (10) according to claim 1, wherein the wave length range of the electromagnetic monitoring signal ($U_s$) is between 30 m and 1 m.

7. The vehicle module (10) according to claim 6, wherein the scattering medium (6) punctiformly contacts and interconnects the circuit carrier (2) and the second part (2b), wherein the scattering medium (6) fills out between 5 and 95% of the volume (V) to be monitored.

8. The vehicle module (10) according to claim 6, wherein the radiation emitted by the electronic control unit (6) in a target mode is utilised as monitoring signal ($U_s$) and the transmitting device in (5a) is thus formed by the electronic control unit (6) or the transmitting device (5a) is formed by a high frequency mixer separate from the electronic control unit (6).

9. The vehicle module (10) according to claim 6, wherein the scattering medium has a di-electricity number $e_r$ and/or a permeability number $m_r$ which differs from the value 1 by at least 25%.

10. The vehicle module (10) according to claim 1, wherein the wave length range of the electromagnetic monitoring signal ($U_s$) is between 1 mm and 30 cm.

11. The vehicle module (10) according to claim 10, wherein the transmitting device (5a) is formed as radar chip (5') for emitting a radar signal which is arranged on the circuit carrier (2) and formed as part of the electronic control device (1).

12. The vehicle module (10) according to claim 1, wherein the transmitting device (5a) and/or the receiving device (5b) are covered by the scattering medium (6) which in the coverage region extends as far as to the second part (3b).

13. The vehicle module (10) according to claim 1, wherein the transmitting device (5a) and/or the receiving device (5b) are enclosed by air and the scattering medium (6) is spaced apart from the transmitting device (5a) and/or the receiving device (5b).

14. The vehicle module (10) according to claim 1, wherein the transmitting device (5a) and the receiving device (5b) are spaced apart from one another and the volume (V) to be monitored is located between the two devices (5a, 5b), wherein the distance between the two devices amounts to at least 50%, preferentially at least 75%, of the length of the circuit carrier.

15. The vehicle module (10) according to claim 1, wherein the monitoring signal (4) is equipped in order to compare the captured actual value ($S_{ist}$) of the fingerprint (FP) with the target value ($S_{soll}$) and in the event of a deviation that is below a limit value, to store and utilise the captured actual value ($S_{ist}$) as new target value ($S_{soll}$) for the next comparison.

16. The vehicle module (10) according to claim 1, wherein the monitoring signal (4) is equipped in order to perform the capture of the actual value ($S_{ist}$) of the fingerprint (FP) and the comparison with the target value ($S_{soll}$) exclusively during the start-up operation of the electronic control unit (1) and in the event of a detection of a manipulation, initiate an error routine.

17. A motor vehicle headlamp comprising a vehicle module (10) according to claim 1.

18. A method for using a vehicle module (10) according to claim 1, wherein during the production and configuration process of the vehicle module (10) a basic setting procedure is carried out in which an initial fingerprint (FP) is established and stored as a reference value in the vehicle module and an external memory.

19. The vehicle module of claim 1, wherein the at least one electrically controllable vehicle function is a light function.

20. The vehicle module of claim 19, wherein the light function is a low-beam light function or a high-beam light function.

* * * * *